United States Patent
Knapp et al.

(10) Patent No.: US 6,747,341 B2
(45) Date of Patent: Jun. 8, 2004

(54) INTEGRATED CIRCUIT AND LAMINATED LEADFRAME PACKAGE

(75) Inventors: James Knapp, Gilbert, AZ (US); Stephen St. Germain, Scottsdale, AZ (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 83 days.

(21) Appl. No.: 10/183,287

(22) Filed: Jun. 27, 2002

(65) Prior Publication Data

US 2004/0000702 A1 Jan. 1, 2004

(51) Int. Cl.[7] .............................................. H01L 23/48
(52) U.S. Cl. ...................... 257/666; 257/781; 257/748; 257/692; 257/735
(58) Field of Search ............................. 257/748, 781, 257/784, 666, 676, 690, 692, 694, 734; 361/723; 438/111, 112, 123

(56) References Cited

U.S. PATENT DOCUMENTS

| | | | |
|---|---|---|---|
| 5,455,387 A | * 10/1995 | Hoffman et al. | 174/52.4 |
| 5,824,950 A | * 10/1998 | Mosley et al. | 174/52.4 |
| 6,091,157 A | * 7/2000 | Black et al. | 257/790 |
| 6,507,098 B1 | 1/2003 | Lo et al. | |
| 6,521,482 B1 | * 2/2003 | Hyoudo et al. | 438/110 |

OTHER PUBLICATIONS http://www.amkor.com/enablingtechnologies/SIP/Index.cfm Amkor Technology, System in Package (SIP) Technology Solution Sheet, at www.amkor.com.

* cited by examiner

Primary Examiner—David A. Zarneke
Assistant Examiner—L. Cruz
(74) Attorney, Agent, or Firm—James J. Stipanuk

(57) ABSTRACT

An integrated circuit (100) includes a semiconductor die (102, 103) and a semiconductor package (101) that has a leadframe (20, 40, 60, 80) for mounting the semiconductor die. The leadframe includes a first laminate (20) whose bottom surface (7) is patterned with leads (106, 107, 131, 132) of the integrated circuit. A second laminate (40) has a bottom surface (3) attached to a top surface (5) of the first laminate to electrically coupling the leads to the semiconductor die.

18 Claims, 4 Drawing Sheets

INTEGRATED CIRCUIT AND LAMINATED LEADFRAME PACKAGE

BACKGROUND OF THE INVENTION

The present invention relates in general to semiconductor devices and, more particularly, to small footprint packaged integrated circuits.

Electronic system manufacturers continue to demand components with higher performance and reliability along with a reduced physical size and manufacturing cost. In response, semiconductor manufacturers are developing techniques to reduce the component size and cost by mounting multiple components on a single leadframe which is encapsulated to form a single integrated circuit package.

The size of an integrated circuit package is determined in part by the minimum feature size of the package's leadframe, which sets the width and spacing of the leads. The minimum feature size typically is about equal to the thickness of the leadframe metal, which is a function of the mechanical requirements of the package and the electrical and thermal specifications of the encapsulated circuit. For example, high power circuits often require thicker leadframe metal to support high current levels and adequately dissipate heat generated by the circuit.

Small interconnect feature sizes previously have been achieved by mounting the circuitry on an interposer. An interposer is a type of printed circuit board with layers of thin metal foil sandwiched between dielectric layers and etched to produce the interconnect lines that electrically connect to the components mounted on the interposer. The metal foil is thin, so small feature sizes are achievable. However, for high current devices, the interposer's thin metal lines must be made wide, which offsets the benefit of using a thin foil layer and increases the package footprint. For high power applications, the high thermal resistance of the interposer's thin metal foil results in inadequate heat removal. Moreover, interposers have a high fabrication cost, which further limits their application.

Other devices use a rolled metal leadframe that achieves small feature sizes by thinning the metal with a half-etch technique that selectively etches away portions of the thickness of the leadframe. However, half etching is poorly controlled, and packages have a low reliability due to inadequate adhesion of the encapsulant to the curved surfaces of the half etched leadframe and the resulting encapsulant liftoff.

Hence, there is a need for an integrated circuit and package that can house multiple components in a small footprint, has a high current and thermal dissipation capability and a high reliability while maintaining a low manufacturing cost.

DETAILED DESCRIPTION OF THE DRAWINGS

In the figures, elements having the same reference number have similar functionality.

Figure 1:
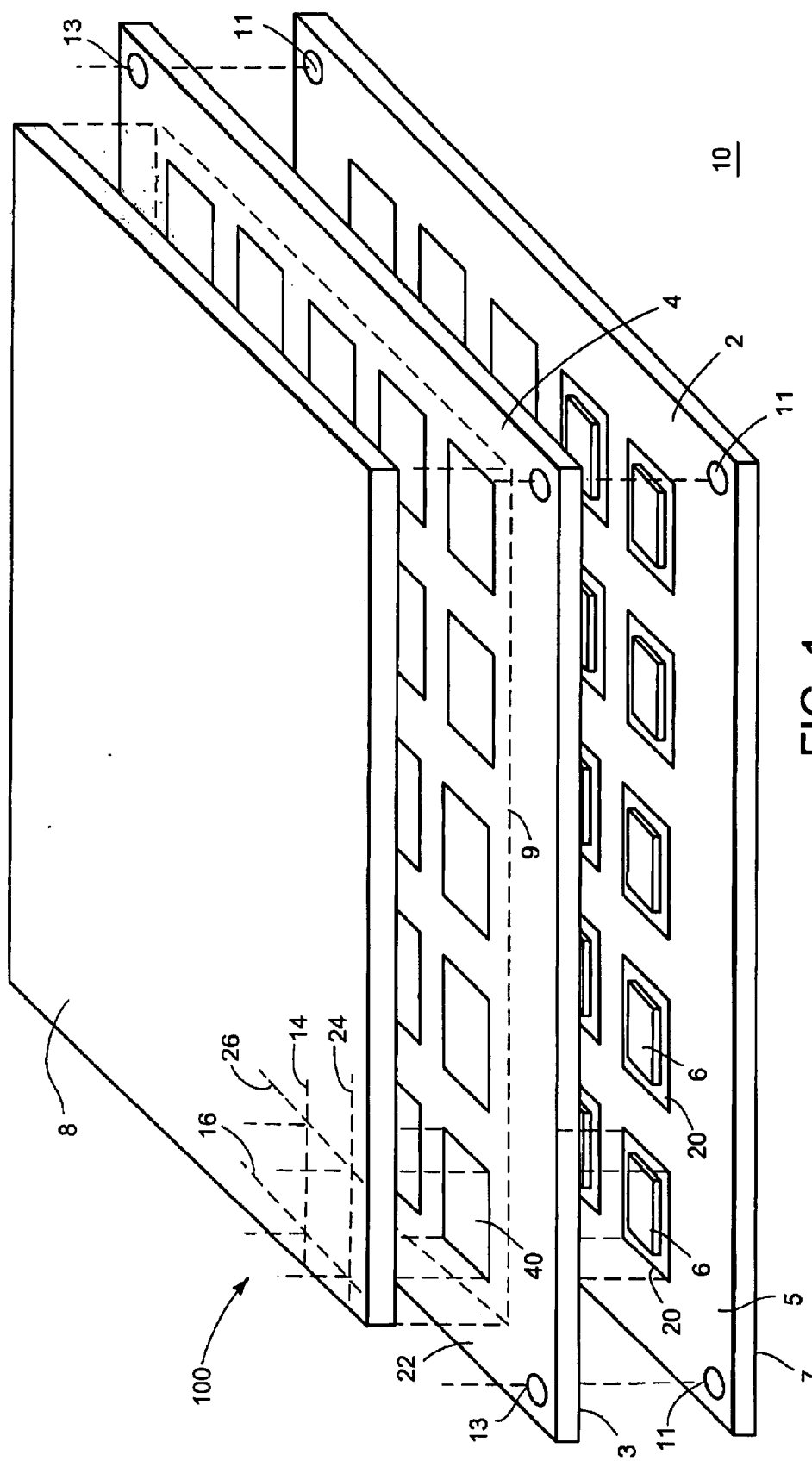
FIG. 1 is an exploded isometric view of a group of integrated circuits at a selected stage of fabrication.

FIG. 1 is an exploded isometric view of an integrated circuit array 10 at a selected stage of fabrication including a leadframe matrix comprising a laminate matrix 2, a laminate matrix 4 and an overmold or blanket encapsulant 8. A plurality of component sets 6 is mounted to predetermined locations of laminate matrix 2. A singulated device from array 10 is referred to as an integrated circuit 100 which is shown prior to singulation. Array 10 is shown as being formed with two laminate matrices but, in some applications, it is advantageous to form leadframe use three or more laminate matrices to achieve a desired level of functionality. Note that component sets 6 are shown as individual components in order to simplify the description, but often include multiple electrical components mounted using a standard pick-and-place tool or similar equipment.

Laminate matrix 2 is formed from a sheet of rolled copper or other conductive material which is patterned to form an array of similarly configured leadframe laminates 20 for mounting component sets 6. Laminate matrix 2 is patterned by etching, stamping, milling or almost any other standard leadframe patterning process. Laminate matrix 2 includes alignment holes 11 through which alignment posts (not shown) are inserted for alignment during fabrication. Laminate matrix 2 typically has a thickness greater than about fifty micrometers.

Laminate matrix 4 is formed in a similar fashion as laminate matrix 2 from a sheet of rolled copper or other conductive material which is patterned to form an array of similarly configured leadframe laminates 40 whose patterns typically are different from the pattern of leadframe laminates 20. A plurality of alignment holes 13 is positioned on the alignment posts mentioned above to align laminate matrices 2 and 4 so that leadframe laminates 40 overlie their corresponding leadframe laminates 20. Laminate matrix 4 typically has a thickness greater than about fifty micrometers and need not be of the same thickness or material as laminate matrix 2. For example, in one embodiment, laminate matrix 2 has a thickness of about fifty micrometers to facilitate etching features with small dimensions, e.g., a high lead density, while laminate matrix 4 has a thickness of one thousand micrometers to selectively provide a high thermal or electrical conductivity.

Array 10 is fabricated as follows. A top surface 5 of laminate matrix 2 is coated with a film of low temperature solder, a conductive epoxy or other conductive material that has both conductive and adhesive properties and can be processed at temperatures less than about three hundred degrees Celsius. A bottom surface 3 of laminate matrix 4 typically is coated with the same material.

Component sets 6 are then mounted to their specified locations and alignment holes 11 and 13 are used to align laminate matrices 2 and 4 while bottom surface 3 is brought into contact with top surface 5. Laminate matrices 2 and 4 then are disposed in a hot press or other standard solder reflow tool to mechanically bond bottom surface 3 to top surface 5, thereby also forming an electrical connection between laminate matrices 2 and 4. Depending on the application, and if not performed earlier in the fabrication cycle, other fabrication processes such as wire bonding typically are performed after laminates 2 and 4 are stacked and attached.

After laminate matrices 2 and 4 are attached, the assembly is placed in a molding tool and encapsulated using a standard thermoset or thermoplastic molding compound to form blanket encapsulant 8. Blanket encapsulant 8 covers component sets 6 and exposed surfaces of laminate matrices 2 and 4 that are within an encapsulant region 9 on a surface 22 of laminate matrix 4. The encapsulation process leaves a bottom surface 7 of laminate matrix 2 uncovered or exposed in order to provide leads for making external electrical connections to integrated circuit 100 after singulation.

After blanket encapsulant 8 is cured, laminate matrices 2 and 4 and blanket encapsulant 8 are sawn along predetermined cut lines to singulate individual packaged integrated circuits. For example, cut lines 14, 24, 16 and 26 define the path of a saw blade that singulates integrated circuit 100 from array 10 to produce an individual packaged device.

The described lamination scheme allows virtually any number of laminate matrices to be used to form a semiconductor package, with the maximum number being a function of the desired functionality, manufacturing cost and final package height.

Figure 2:
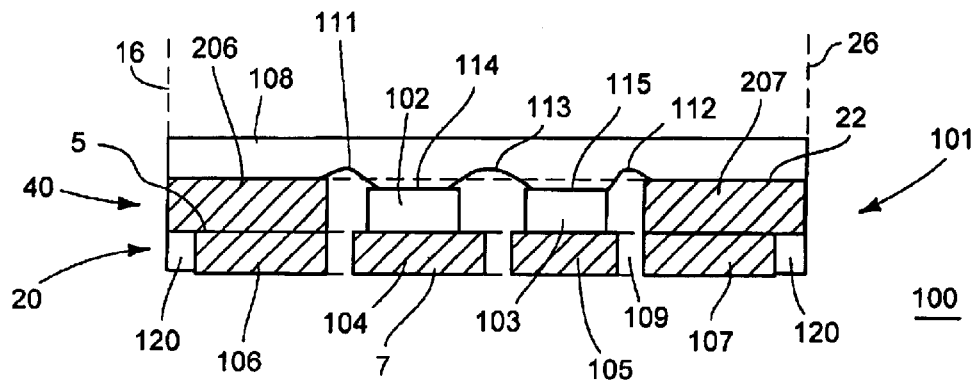
FIG. 2 is a cross-sectional view of a packaged integrated circuit.

FIG. 2 shows a cross-sectional view of integrated circuit 100 where component set 6 consists of semiconductor dice 102 and 103 which are housed in a package 101 that includes laminates 20 and 40 and a singulated encapsulant 108 of blanket encapsulant 8. Note the left and right surfaces of integrated circuit 100 being defined by cut lines 16 and 26, respectively.

Laminate 20 is etched to form die flags 104–105 for mounting semiconductor dice 102–103, respectively, and leads 106–107. With current processing technology, the minimum feature size of laminate 20, such as a spacing 109 between die flag 105 and lead 107, is about equal to its thickness. Hence, in one embodiment, where laminate 20 is two hundred fifty micrometers thick, the width of spacing 109 is also about two hundred fifty micrometers.

Laminate 40 is attached at bottom surface 3 to top surface 5 of laminate 20 as shown, with regions 206 and 207 electrically and mechanically connected to leads 106 and 107. Material is removed from laminate 40 in the region overlying die flags 104–105 so semiconductor dice 102–103 can be mounted on laminate matrix 2 and further processed without damage. The thickness of laminate 40 is selected to be somewhat greater than the thickness of semiconductor dice 102–102 so that top surfaces 114–115 of semiconductor dice 102–103 are recessed below the plane of surface 22. For example, in an embodiment where semiconductor dice 102–103 have a thickness of about two hundred fifty micrometers, the thickness of laminate 40 is selected to be about three hundred micrometers.

A wire bond 111 is formed between semiconductor die 102 and region 206 to make an external electrical connection from semiconductor die 102 through wire bond 111, region 206 and lead 106. Similarly, a wire bond 112 is formed between semiconductor die 103 and region 207 for making an external electrical connection from semiconductor die 103 through wire bond 112, region 207 and lead 107. Electrical connection to external devices or a printed circuit board is made through features defined on bottom surface 7, which remains exposed after the encapsulation process. A wire bond 113 is formed between semiconductor dice 102 and 103 to provide a direct internal connection.

Surfaces 114–115 of semiconductor dice 102–103 lie in a plane below surface 22, or nearly so. As a result, the loop height of wire bonds 111 and 112 is made significantly lower than would be possible with other semiconductor packaging techniques without introducing mechanical stresses in wire bonds 111–112. The short loop height reduces the overall length of wire bonds 111–112, which provides a low parasitic inductance and resistance that improves the frequency response and overall performance of integrated circuit 100. Moreover, since the height of surface 22 is determined by the thickness of laminate 40, control over the loop height is improved and performance is more consistent.

Note that regions 206–207 are defined by cut lines 16 and 26, respectively, while leads 106–107 are recessed a distance from cut line 16 and 16, respectively. In effect, the bottom surfaces of regions 206–207 extend outwardly to form a shelf. This arrangement allows encapsulating material to flow under and cover exposed portions of regions 206–207 to form mold locks 120. Many semiconductor packages use mold locks to improve mechanical adhesion and prevent encapsulant lift-off to improve reliability. Because laminates are used to form mold locks 120, their edges are substantially orthogonal, which produces a higher mechanical and adhesive strength than what is achievable with the curved surfaces of mold locks formed with a half-etching process.

Figure 3:
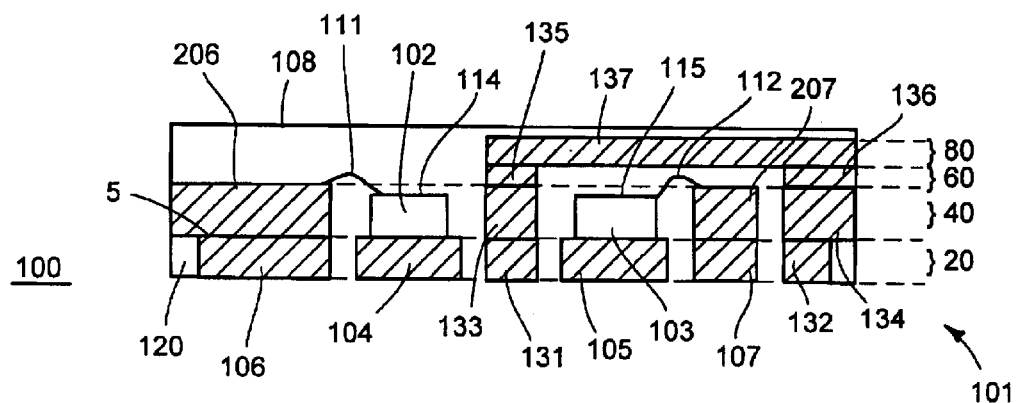
FIG. 3 is a cross-sectional view of the packaged integrated circuit in an alternate embodiment.

FIG. 3 shows a cross-sectional view of integrated circuit 100 in an alternate embodiment as, for example, a transceiver in a wireless communications device. The elements of integrated circuit 100 have structures and functionality similar to what is shown and described in FIG. 2, except that package 101 is formed as a four-tiered lamination including laminates 20 and 40, a laminate 60 formed over laminate 40 and a laminate 80 formed over laminate 60 as shown. Semiconductor die 102 is configured as a high frequency, low noise amplifier while semiconductor die 103 is configured as a high frequency, high power transmitting stage. In one embodiment, semiconductor dice 102–103 are specified to operate at a frequency greater than six gigahertz.

Regions 131–132 of laminate 20 function as leads of integrated circuit 100. Regions 133–134 of laminate 40 and regions 135–136 of laminate 60 are stacked as shown to function as spacers that support a region 137 of laminate 80 at a height that avoids coming into electrical contact with wire bond 112. Regions 131–137 are electrically coupled together to function as a Faraday cage or electromagnetic shield around semiconductor die 103. Such shielding substantially blocks electromagnetic waves generated by semiconductor die 103 from propagating to semiconductor die 102, or vice versa. As a result of using a lamination scheme to form package 101, semiconductor dice 102–103 are shielded from each other. Moreover, electromagnetic interference is reduced, both internally and externally to package 101, while maintaining a low fabrication cost.

Figure 4:
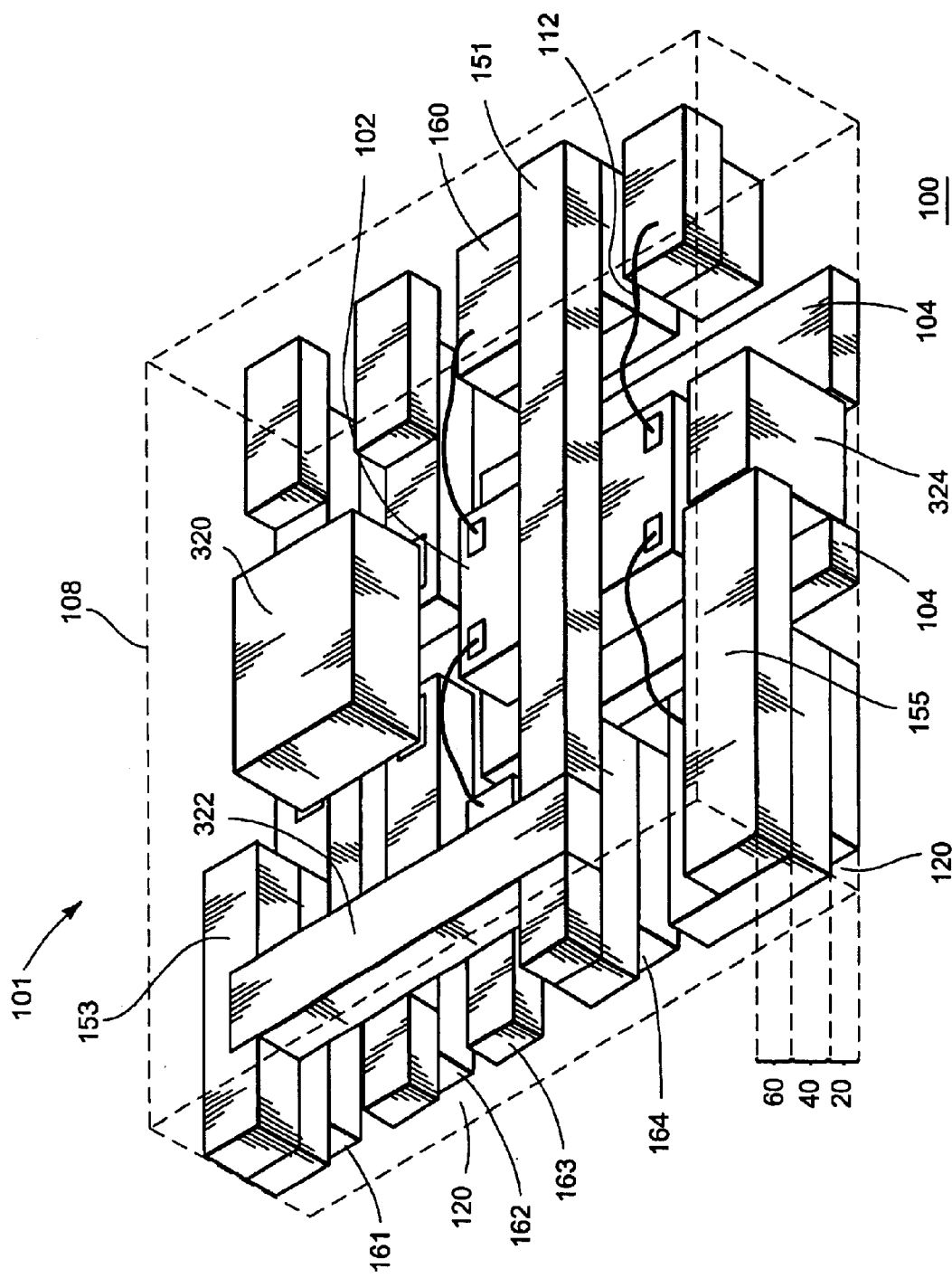
FIG. 4 is an isometric view of the integrated circuit in another alternate embodiment.

FIG. 4 shows an isometric view of integrated circuit 100 in yet another embodiment, including a semiconductor package 101 formed with laminates 20, 40 and 60 and encapsulant 108, and component set 6 that comprises semiconductor die 102, a packaged semiconductor device 320 and passive components including an inductor 322 and a PI bypass capacitor 324.

Packaged semiconductor device 320 is implemented as an encapsulated, fully tested integrated circuit that is housed in package 101 and re-encapsulated with encapsulant 108. Since there is no need to use a guide clamp or wire bonding tool, packaged semiconductor device 320 can be disposed closer to semiconductor die 102 than could another bare die. Hence, in many cases such a "package-within-a-package" can be formed with a smaller size than what is needed to house two separate unpackaged semiconductor dice in the same package. Moreover, by final testing packaged semiconductor device 320 prior to housing in package 101, the overall yield is improved and the fabrication cost is reduced.

Inductor 322 is electrically coupled between regions 151 and 153 of laminate 60 as shown and to leads 161 and 164. Note that inductor 322 is disposed laterally and crosses over leads 162 and 163, thereby providing a flexible, low cost interconnection scheme. In one embodiment, inductor 322 produces an inductance of about one microhenry.

Capacitor 324 is mounted vertically between different laminates, i.e., between die flag 104 of laminate 20 and region 155 of laminate 60. This use of laminates allows capacitor 324 to be physically located within package 101 adjacent to semiconductor die 102, where its filtering function is most effective because internally housed components such as capacitor 324 have a lower parasitic inductance and resistance.

Figure 5:
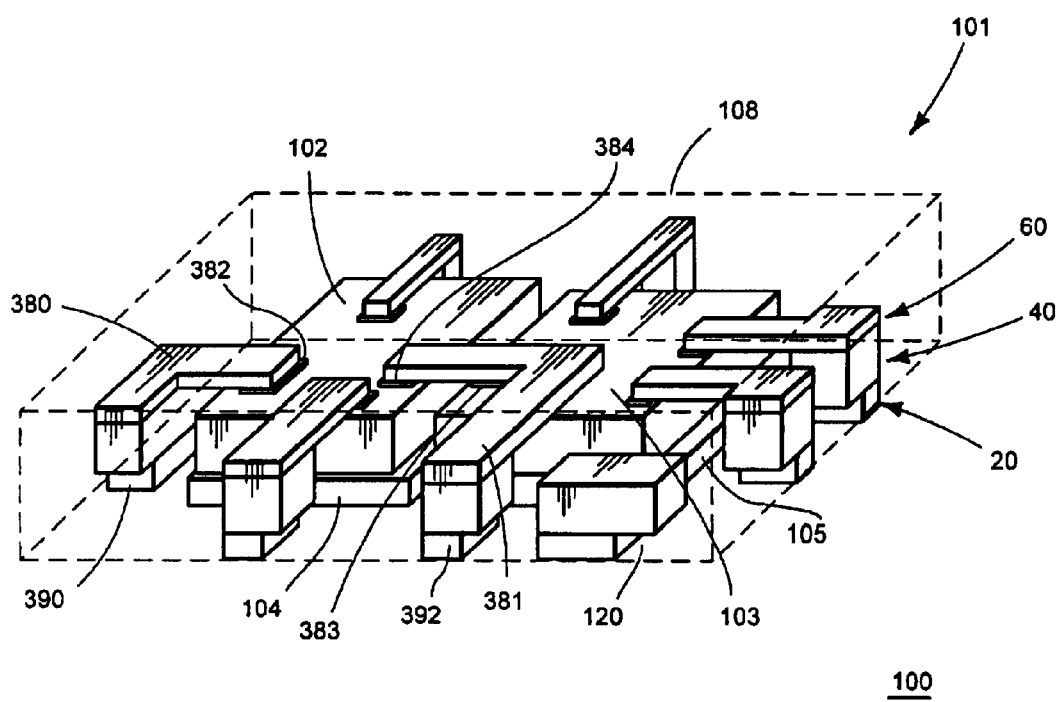
FIG. 5 is an isometric view of the integrated circuit in yet another alternate embodiment.

FIG. 5 is an isometric view of integrated circuit 100 in still another alternate embodiment, including semiconductor package 101 formed with laminates 20, 40 and 60, encapsulant 108 and semiconductor dice 102–103.

Semiconductor die 102 is formed with bonding regions 382 and 384 and semiconductor die 103 is formed with a bonding region 383 for making electrical contacts. In one embodiment, bonding regions 382–384 are formed as bonding pads with a standard semiconductor interconnect material such as aluminum or copper. In another embodiment, bonding regions 382–384 may include a built-up layer such as solder balls, plated copper or solder and the like.

To provide external electrical connections, laminate 60 is formed with interconnect regions such as a laminate region 380 that electrically couples bonding region 382 to a lead 390, and a laminate region 381 that electrically couples bonding regions 383–384 to a lead 392. Electrical attachments are achieved using a standard thermal compression or ultrasonic bonding process or a solder reflow process. Laminate 60 preferably is thin and therefore liable enough to facilitate bonding and to have a small feature size compatible with integrated circuit bonding features. In one embodiment, laminate 60 is formed to a thickness of about fifty micrometers.

Note that laminate 60 provides not only a structure for electrically coupling a semiconductor die to a package lead, but also for electrically coupling between semiconductor dice housed in the same package. Moreover, bonding with laminate regions 380–381 avoids the wire loops that are neded with standard wire bonds, which results in a low parasitic inductance and a high operating frequency. In addition, high currents are easily accommodated by simply raking high current laminate regions wide enough to reliably handle the high current, thereby avoiding the need for multiple bonding wires or even larger bonding wires. In fact, a small feature size can be combined with a high current capability and a low fabrication cost in the same structure by forming laminate 60 with the appropriate feature sizes.

In summary, the present invention provides a low cost integrated circuit and package that economically combines small features with a high current capability. A leadframe for mounting a semiconductor die is formed with a first laminate whose bottom surface is patterned with a lead of the integrated circuit. A second laminate has a bottom surface attached to a top surface of the first laminate to electrically couple the lead to the semiconductor die. The invention provides a low cost structure that combines a high lead density with a high current capability and provides higher quality lead locks, crossover interconnections and electromagnetic shielding. The need for individual bonding wires is avoided by forming the second laminate in the desired bonding pattern, resulting in a higher performance and lower cost than other structures.

What is claimed is:

1. An integrated circuit, comprising;
   a first semiconductor die; and
   a leadframe including
   a first laminate having exposed surface formed a lead of the integrated circuit and a second surface for mounting the first semiconductor die, and
   a second laminate having a first surface attached to the second surface of the first laminate for electrically coupling the lead to the first semiconductor die.

2. The integrated circuit of claim 1, further comprising a molding compound for encapsulating the first semiconductor die.

3. The integrated circuit of claim 2, wherein the second laminate forms a mold lock for the molding compound.

4. The integrated circuit of claim 3, wherein the second laminate forms a shelf over the lead and the molding compound covers the shelf.

5. The integrated circuit of claim 1, wherein a first surface of the first semiconductor die is mounted on the second surface of the first laminate, and the second laminate has a thickness greater than a thickness of the first semiconductor die.

6. The integrated circuit of claim 5, wherein the leadframe further includes a third laminate having a first surface attached to a second surface of the second laminate and patterned with a bonding strip for attaching to a bonding pad of the first semiconductor die.

7. The integrated circuit of claim 5, wherein the leadframe further includes a third laminate that extends over the first semiconductor die to form an electromagnetic shield.

8. The integrated circuit of claim 1, further comprising a bonding wire for electrically coupling a pad of the first semiconductor die to the second laminate.

9. The integrated circuit of claim 1, further comprising an electrical component having a first electrode attached to the first laminate and a second electrode attached to the second laminate.

10. The integrated circuit of claim 1, further comprising a second semiconductor die mounted to the leadframe.

11. The integrated circuit of claim 10, wherein a first interconnect line of the first laminate is electrically coupled through the second laminate to a bonding pad of the first semiconductor die.

12. The integrated circuit of claim 11, wherein the second laminate is formed with a second interconnect line that is electrically coupled to a bonding pad of the second semiconductor die and crosses under the first interconnect line.

13. The integrated circuit of claim 1, wherein the first and second laminates are formed with a conductive material.

14. The integrated circuit of claim 13, wherein the first and second laminates are each formed to a thickness greater than fifty micrometers.

15. A semiconductor package for housing a semiconductor die, comprising a leadframe that includes:
   a first conductive laminate having an exposed surface patterned for making external electrical connections, and a second surface for mounting the semiconductor die; and
   a second conductive laminate attached to the second surface of the first conductive laminate and providing a signal path from the semiconductor die to the first conductive laminate.

16. The semiconductor package of claim 15, further comprising a molding compound for encapsulating the semiconductor die.

17. The semiconductor package of claim 16, wherein the second conductive laminate extends beyond an edge of the first conductive laminate to form a mold lock that secures the molding compound.

18. A semiconductor device, comprising:

a semiconductor die; and a leadframe formed as stacked conductive laminates, one of the stacked conductive laminates patterned to form an external lead of the semiconductor device and having a surface for mounting the semiconductor die, and another of the stacked conductive laminates patterned for electrically coupling a bonding pad of the semiconductor die to the external lead.

* * * * *